(12) United States Patent
Curley et al.

(10) Patent No.: US 7,979,732 B2
(45) Date of Patent: Jul. 12, 2011

(54) EFFICIENT UTILIZATION OF A MULTI-SOURCE NETWORK OF CONTROL LOGIC TO ACHIEVE TIMING CLOSURE IN A CLOCKED LOGIC CIRCUIT

(75) Inventors: Lawrence D. Curley, Round Rock, TX (US); John M. Isakson, Austin, TX (US); Arjen Mets, Sleepy Hollow, NY (US); Travis W. Pouarz, Austin, TX (US); Thomas E. Rosser, Austin, TX (US); Kristen M. Tucker, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1042 days.

(21) Appl. No.: 11/772,908

(22) Filed: Jul. 3, 2007

(65) Prior Publication Data

US 2009/0013206 A1 Jan. 8, 2009

(51) Int. Cl.
*G06F 1/12* (2006.01)
*G06F 1/14* (2006.01)

(52) U.S. Cl. ........ 713/600; 713/400; 713/401; 713/500; 713/501; 713/502; 713/503; 713/601; 716/113; 716/114

(58) Field of Classification Search .................. 713/400, 713/401, 500–503, 600, 601; 716/1–21, 716/113, 114
See application file for complete search history.

(56) References Cited

U.S. PATENT DOCUMENTS

| | | | |
|---|---|---|---|
| 6,266,803 B1* | 7/2001 | Scherer et al. | 716/12 |
| 6,711,716 B1* | 3/2004 | Mueller et al. | 716/1 |
| 2006/0190886 A1* | 8/2006 | Lu et al. | 716/6 |
| 2007/0286323 A1* | 12/2007 | Shimobeppu | 375/376 |

* cited by examiner

*Primary Examiner* — Thomas Lee
*Assistant Examiner* — Fahmida Rahman
(74) *Attorney, Agent, or Firm* — Francis Lammas; Stephen J. Walder, Jr.; Diana R. Gerhardt (57) ABSTRACT

A method, system, and computer program product are provided for achieving timing closure in a clocked logic circuit. For each local clock buffer in a set of local clock buffers, a logic synthesis tool determines a clock control signal input from a set of clock control signal inputs that will drive a clock control signal to the local clock buffer at a target frequency such that a first timing constraint may be met. The operation performed by the logic synthesis tool forms a determined clock control signal input. Responsive to the logic synthesis tool determining the determined clock control signal input, the logic synthesis tool couples the local clock buffer to the determined clock control signal input that drives the clock control signal to the local clock buffer at the target frequency to achieve timing closure in the clocked logic circuit.

17 Claims, 7 Drawing Sheets

EFFICIENT UTILIZATION OF A MULTI-SOURCE NETWORK OF CONTROL LOGIC TO ACHIEVE TIMING CLOSURE IN A CLOCKED LOGIC CIRCUIT

BACKGROUND

1. Technical Field

The present application relates generally to an improved data processing system and method. More specifically, the present application is directed to efficient utilization of a multi-source network of control logic to achieve timing closure in a clocked logic circuit.

2. Description of Related Art

Semiconductor integrated circuits comprise the majority of electronic circuits in computers and other digital electronic products. Present integrated circuits may contain millions of transistors and may be configured, for example, as a central processing unit (CPU), arithmetic logic unit (ALU), random access memory (RAM), programmable logic array (PLA), application specific integrated circuit (ASIC), or digital signal processor (DSP). Both sophistication and speed of operation of these integrated circuits have rapidly increased because of improvements in integrated circuit manufacturing technologies resulting in smaller and faster devices.

In complex digital integrated circuits, a clock control signal is normally required to operate multi-state clocked logic circuits, such as the aforementioned CPU, ALU, RAM, PLA, ASIC, and DSP integrated circuits. The clock control signal is distributed throughout the integrated circuit to clocked logic circuits contained therein. Multiple clock control signals may be desired, or required, depending on the functionality of the integrated circuit.

Figure 1:
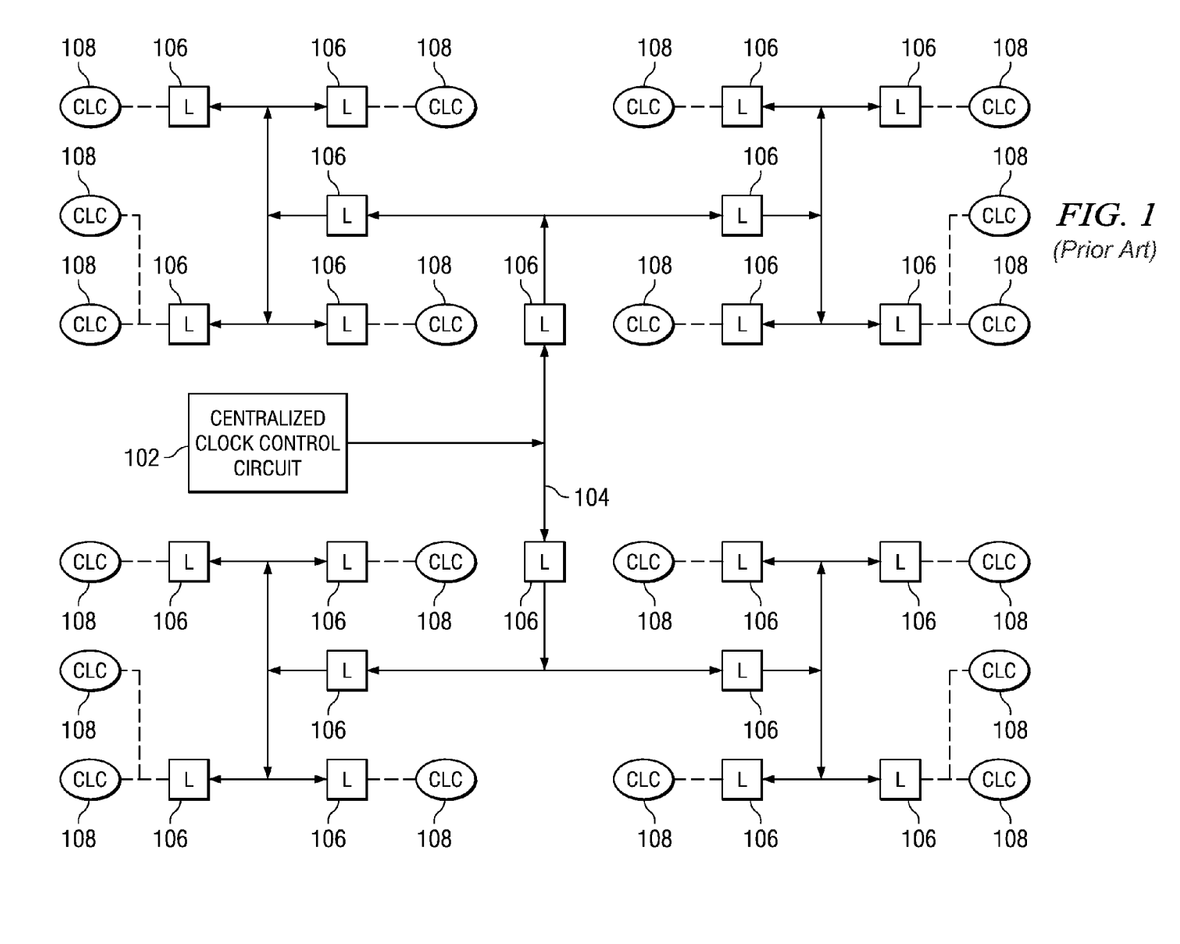
FIG. 1 illustrates the distribution of a clock control signal in an integrated circuit.

Design of complex integrated circuits is accomplished by computer simulation which allows an integrated circuit designer to easily implement and test the design before committing it to silicon. In designing the integrated circuit layout by computer, one of the requirements is to distribute the aforementioned clock control signal. FIG. 1 illustrates the distribution of a clock control signal in an integrated circuit. As shown in FIG. 1, centralized clock control circuit 102 routes clock control signal 104 though staging latches 106 to clocked logic circuits 108. Clock control signal 104 from centralized clock control circuit 102 is routed by means of a main trunk that feeds staging latches 106 that in turn feeds tributaries. The tributaries in turn drive clocked logic circuits 108 that require clock control signal 104. Clock distribution technology utilizes a main trunk with tributaries branching out from the main trunk as needed for connection to clocked logic circuits 108 within the integrated circuit.

Figure 2:
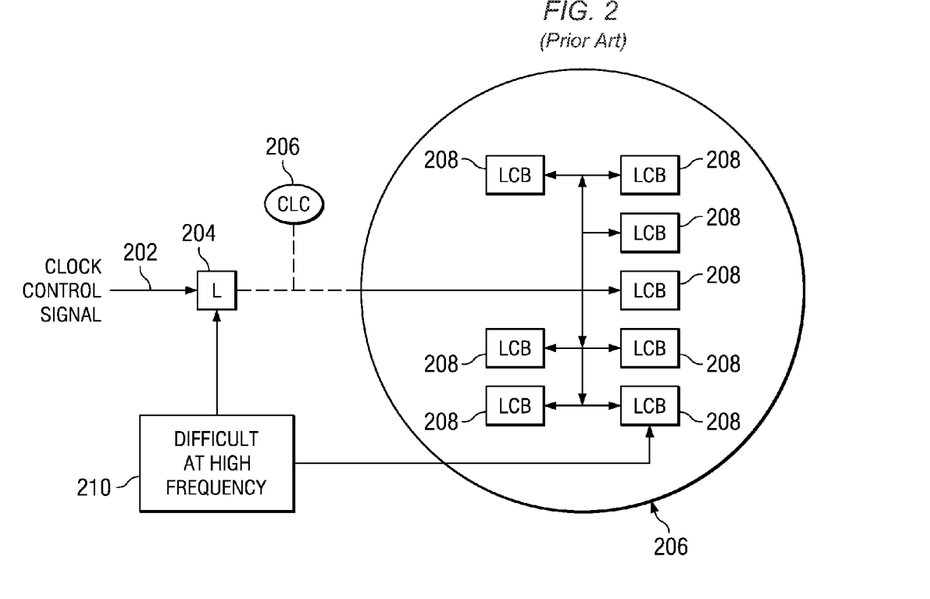
FIG. 2 illustrates the distribution of a clock control signal within a clocked logic circuit.

Depending on the loading requirements of the integrated circuit logic, active device buffer circuits, commonly called local clock buffers, are used to drive latches within the clocked logic circuit. FIG. 2 illustrates the distribution of a clock control signal within a clocked logic circuit. As shown in FIG. 2, clock control signal 202 is fed to staging latch 204 which in turn feeds clocked logic circuits 206. As stated above, within clocked logic circuits 206 there may be one or more local clock buffers (LCBs) 208. However, when clocked logic circuits 206 contain a large number of LCBs, it may be difficult to construct a signal distribution network which can drive clock control signal 202 to each of the LCBs at a high frequency, indicated by point 210.

That is, all electronic circuit loads have resistance, inductance, and capacitance inherent with the physical structure of the integrated circuit. Integrated circuit devices have predominately resistance and capacitance. The resistance "R" and capacitance "C" create an RC time constant delay to a fast rising edge square wave, such as a clock control signal. Excessive delays in the clock control signals can produce unpredictable behavior by the LCBs. Reliable operation of clocked logic circuits within an integrated circuit depends upon the LCBs behaving properly. If a clock control signal is delayed, the clocked logic circuit may not function properly, potentially causing system instability.

One current solution involves restructuring of the logic in order to reduce the clocked logic circuit into multiple clocked logic circuits, each containing a smaller number of logic devices. This solution is undesirable since it may force the design to be partitioned in a manner which is substantially non-optimal. Another solution is to implement custom-designed distribution network which has smaller propagation delays than that produced by the logic synthesis tool. This is undesirable because it requires manual intervention for a clocked logic circuit which is intended to be implemented purely thru automated design tools.

SUMMARY

The illustrative embodiments provide multiple inputs for a clock control signal at the interface of a clocked logic circuit. The described system provides for determining a required number of local clock buffers needed to drive the latches, which in turn drive combinatorial logic circuits of the clocked logic circuit in order that the clock control signal is driven to the LCBs at the target frequency. The described system also provides for the recognition of the logical equivalence of each of the multiple clock control signal inputs and makes the most optimal choice of which of the multiple clock control signal inputs to connect to each local clock buffer in the clocked logic circuit. The illustrative embodiments read parameters of the clocked logic circuit and the multiple clock control signal inputs thru a schematic netlist to verify the logical equivalence of the clocked logic circuit.

The illustrative embodiments provide for achieving timing closure in a clocked logic circuit. For each local clock buffer in a set of local clock buffers, the illustrative embodiments determine a clock control signal input from a set of clock control signal inputs that will drive a clock control signal to the local clock buffer at a target frequency such that a first timing constraint may be met, forming a determined clock control signal input. The illustrative embodiments couple the local clock buffer to the determined clock control signal input that drives the clock control signal to the local clock buffer at the target frequency to achieve timing closure in the clocked logic circuit in response to determining the determined clock control signal input.

The illustrative embodiments generate a schematic netlist and statistics that indicate where the first timing constraint could not be met in response to a failure to determine the clock control signal input from the set of clock control signal inputs that will drive the clock control signal to the local clock buffer at the target frequency such that the first timing constraint may be met.

For each latch in a set of latches, the illustrative embodiments determine if a second timing constraint is met such that a clock signal is driven from the local clock buffer to the latch at a target frequency. The illustrative embodiments determine a number of times the local clock buffer would need to be cloned in order to drive the latch with the clock signal at the target frequency such that the second timing constraint may be met in response to a failure to drive the latch with the clock signal at the target frequency. The illustrative embodiments automatically clone the local clock buffer the determined number of times, thereby forming a set of local clock buffers.

For each latch in a set of latches, the illustrative embodiments determine which local clock buffer in the set of local clock buffers will drive the latch with the clock signal at the target frequency such that the second timing constraint may be met, thereby forming a determined local clock buffer. The illustrative embodiments couple the latch to the determined local clock buffer to achieve timing closure in the clocked logic circuit in response to determining the determined local clock buffer.

In the illustrative embodiments the first timing constraint and the second timing constraint may be dependent on a physical placement of the set of latches, the set of local clock buffers, and the set of clock control signal inputs within a physical boundary of the clocked logic circuit.

In the illustrative embodiments the physical placement of the set of latches and the set of local clock buffers within the physical boundary may be arbitrary as long as the first timing constraint and the second timing constraint can be met. Additionally, in the illustrative embodiments the physical placement of the set of clock control signal inputs may be fixed as defined by data associated with the physical boundary of the clocked logic circuit.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, a system is provided. The system may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

Figure 3:
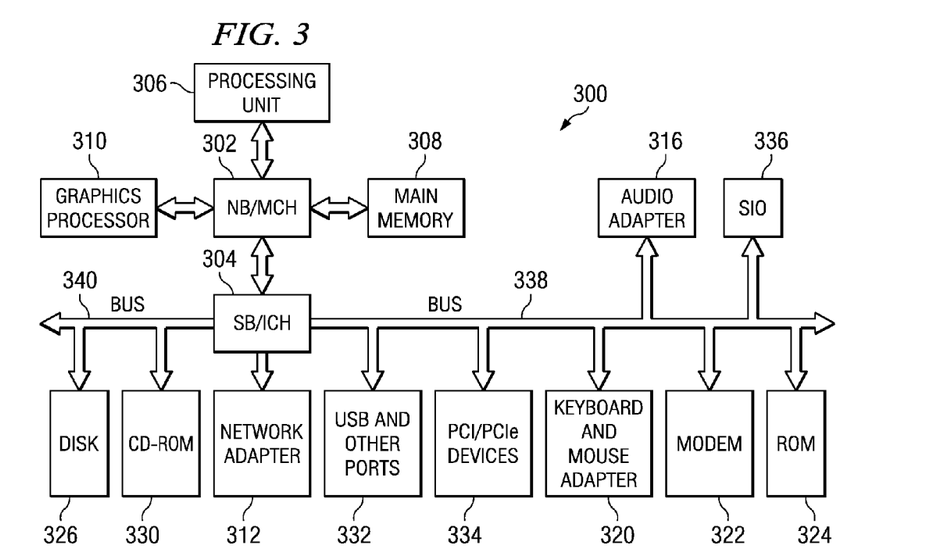
FIG. 3 is a block diagram of an exemplary data processing system in which aspects of the illustrative embodiments may be implemented.

The illustrative embodiments provide for an efficient utilization of a multi-source network of control logic to achieve timing closure in a clocked logic circuit. FIG. 3 is provided as an exemplary diagram of a data processing environment in which embodiments of the present invention may be implemented. It should be appreciated that FIG. 3 is only exemplary and is not intended to assert or imply any limitation with regard to the environments in which aspects or embodiments of the present invention may be implemented. Many modifications to the depicted environments may be made without departing from the spirit and scope of the present invention.

With reference now to FIG. 3, a block diagram of a data processing system is shown in which illustrative embodiments may be implemented. Data processing system 300 is an example of a computer in which computer usable code or instructions implementing the processes may be located for the illustrative embodiments.

In the depicted example, data processing system 300 employs a hub architecture including a north bridge and memory controller hub (MCH) 302 and a south bridge and input/output (I/O) controller hub (ICH) 304. Processing unit 306, main memory 308, and graphics processor 310 are coupled to north bridge and memory controller hub 302. Processing unit 306 may contain one or more processors and even may be implemented using one or more heterogeneous processor systems. Graphics processor 310 may be coupled to the MCH through an accelerated graphics port (AGP), for example.

In the depicted example, local area network (LAN) adapter 312 is coupled to south bridge and I/O controller hub 304 and audio adapter 316, keyboard and mouse adapter 320, modem 322, read only memory (ROM) 324, universal serial bus (USB) ports and other communications ports 332, and PCI/PCIe devices 334 are coupled to south bridge and I/O controller hub 304 through bus 338, and hard disk drive (HDD) 326 and CD-ROM drive 330 are coupled to south bridge and I/O controller hub 304 through bus 340. PCI/PCIe devices may include, for example, Ethernet adapters, add-in cards, and PC cards for notebook computers. PCI uses a card bus controller, while PCIe does not. ROM 324 may be, for example, a flash binary input/output system (BIOS). Hard disk drive 326 and CD-ROM drive 330 may use, for example, an integrated drive electronics (IDE) or serial advanced technology attachment (SATA) interface. A super I/O (SIO) device 336 may be coupled to south bridge and I/O controller hub 304.

An operating system runs on processing unit 306 and coordinates and provides control of various components within data processing system 300 in FIG. 3. The operating system may be a commercially available operating system such as Microsoft® Windows® XP (Microsoft and Windows are trademarks of Microsoft Corporation in the United States, other countries, or both). An object oriented programming system, such as the Java™ programming system, may run in conjunction with the operating system and provides calls to the operating system from Java programs or applications executing on data processing system 300. Java and all Java-based trademarks are trademarks of Sun Microsystems, Inc. in the United States, other countries, or both.

Instructions for the operating system, the object-oriented programming system, and applications or programs are located on storage devices, such as hard disk drive 326, and may be loaded into main memory 308 for execution by processing unit 306. The processes of the illustrative embodiments may be performed by processing unit 306 using computer implemented instructions, which may be located in a memory such as, for example, main memory 308, read only memory 324, or in one or more peripheral devices.

The hardware in FIG. 3 may vary depending on the implementation. Other internal hardware or peripheral devices, such as flash memory, equivalent non-volatile memory, or optical disk drives and the like, may be used in addition to or in place of the hardware depicted in FIG. 3. Also, the processes of the illustrative embodiments may be applied to a multiprocessor data processing system.

In some illustrative examples, a bus system may be comprised of one or more buses, such as a system bus, an I/O bus and a PCI bus. Of course the bus system may be implemented using any type of communications fabric or architecture that provides for a transfer of data between different components or devices attached to the fabric or architecture. A communications unit may include one or more devices used to transmit and receive data, such as a modem or a network adapter. A memory may be, for example, main memory 308 or a cache such as found in north bridge and memory controller hub 302. A processing unit may include one or more processors or CPUs. The depicted examples in FIG. 3 and above-described examples are not meant to imply architectural limitations. For example, data processing system 300 also may be a tablet computer, laptop computer, telephone device, a personal digital assistant (PDA), or the like.

The illustrative embodiments provide multiple inputs for a clock control signal at the interface of a clocked logic circuit. At the design level of this clocked logic circuit, each of these clock control signal inputs may be connected to different, but logically equivalent, latched clock control signals. The described system provides for determining a required number of local clock buffers (LCBs) needed to drive the latches, which in turn drive the combinatorial logic circuits of the clocked logic circuit in order that the clock control signal is driven to the LCBs at the target frequency. The described system also provides for the recognition of the logical equivalence of each of the multiple clock control signal inputs and makes the most optimal choice of which of the multiple clock control signal inputs to connect to each local clock buffer in the clocked logic circuit. The illustrative embodiments read parameters of the clocked logic circuit and the multiple clock control signal inputs thru a schematic netlist to verify the logical equivalence of the clocked logic circuit.

Figure 4:
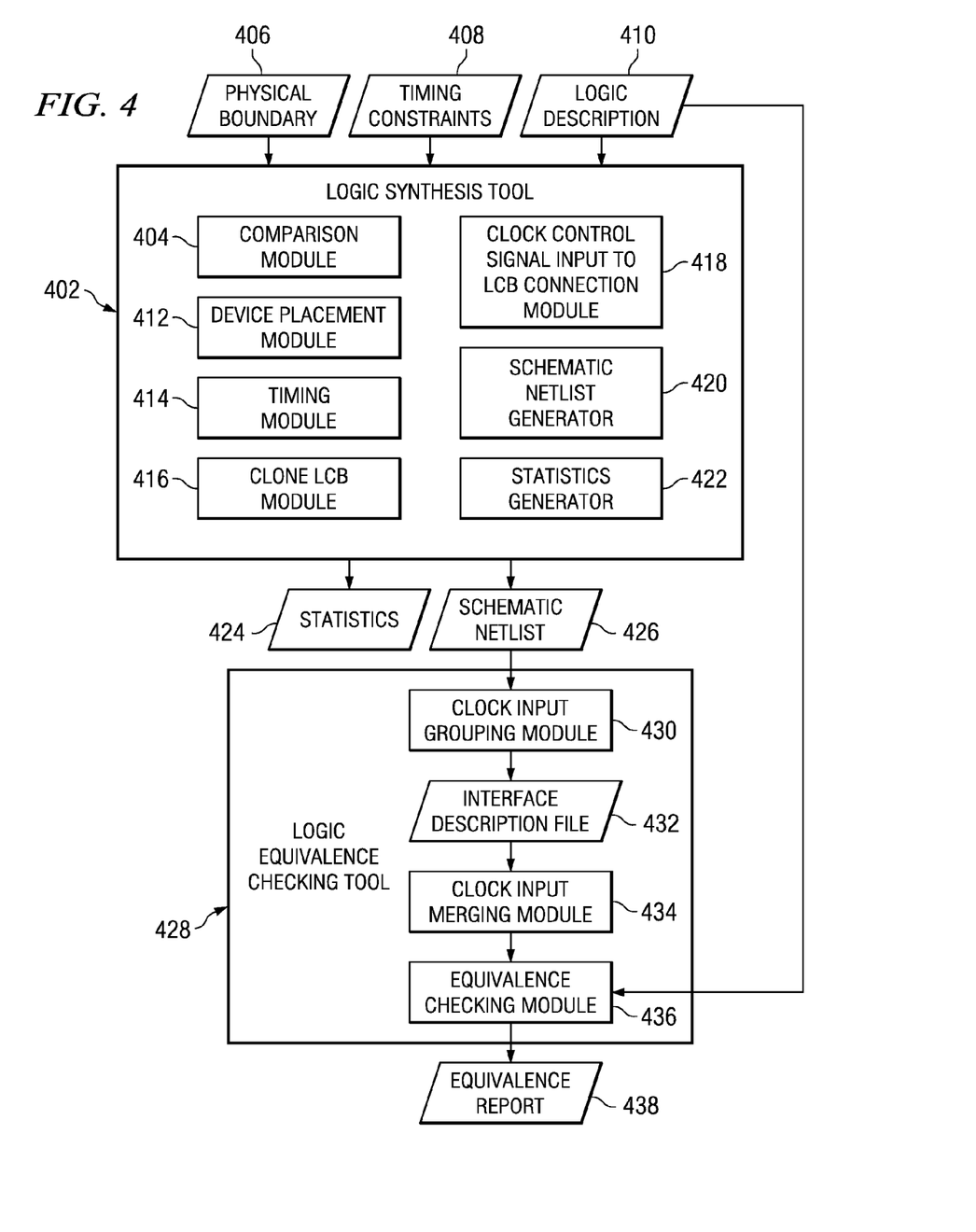
FIG. 4 depicts an exemplary logical synthesis and logical equivalence check of a clocked logic circuit in order to achieve timing closure in accordance with an illustrative embodiment.

FIG. 4 depicts an exemplary logical synthesis and logical equivalence check of a clocked logic circuit in order to achieve timing closure in accordance with an illustrative embodiment. Logic synthesis tool 402 includes comparison module 404 that receives physical boundary data 406, timing constraints data 408, and logic description data 410 as inputs of a clocked logic circuit. A clocked logic circuit may encompass a portion of an integrated circuit or the entire integrated circuit. Physical boundary data 406 provides the physical bounds of the clocked logic circuit, such as dimensions, clock control signal input locations, or the like. Timing constraints data 408 may include the maximum system clock frequency, predicted arrival times of signals coming into the clocked logic circuit, required departure times of outgoing signals, or the like. The illustrative embodiments may use only one timing constraint or a plurality of timing constraints. Logic description data 410 is written in a hardware descriptive language that describes how the logic of the clocked logic circuit operates, such as Very High Speed Integrated Circuit (VHSIC) Hardware Description Language (VHDL), Verilog®, or the like. Logic description data 410 includes, for example, a user determined number of latches, one LCB, a connection to the LCB from one of the clock control signal inputs, combinatorial logic equations that define the function of the clocked logic circuit, or the like.

Comparison module 404 performs a comparison check by comparing the data included in the inputs to assure that the data provided by the three inputs agree, prior to continuing the logic synthesis. That is, comparison module 404 verifies that data in one input agrees with similar data included in one or more of the inputs. Once comparison module 404 completes the comparison check, device placement module 412 performs an initial placement of the combinatorial logic circuits, the latches, and the LCB defined in logic description data 410 within the physical bounds of the clocked logic circuit defined by physical boundary data 406. The initial placement of the devices may or may not be the final location of the devices as logic synthesis tool 402 determines through a number of iterations a placement of all devices in order to meet the timing constraints of the clocked logic circuit.

Once device placement module 412 completes placement of the devices from logic description data 410, logic synthesis tool 402 initiates timing module 414 to determine if the target frequency has been achieved for all required signals, including the clock control signals. If timing module 414 determines that the latches are not receiving the clock signal at the target frequency, then clone LCB module 416 clones LCBs as needed in order to drive the latches at the target frequency. Thus, the modules of logic synthesis tool 402 determine the required number of LCBs needed to drive the latches, which in turn drive the combinatorial logic circuits of the clocked logic circuit in order that the clock control signal is driven to the LCBs at the target frequency. Once clone LCB module 416 clones an acceptable number of LCBs to satisfy the timing requirements from LCBs to latches and device placement module 412 places the cloned LCBs within the physical bounds of the clocked logic circuit defined by physical boundary data 406, clock control signal input to LCB connection module 418 determines which clock control signal input to connect to which LCBs in order that the clock control signal is driven to the LCB at the target frequency.

Logic synthesis tool 402 may perform numerous iterations of connecting clock control signal inputs to the various LCBs using a clock control signal input to LCB connection module 418 in order that each LCB that drives a latch receives the clock control signal at the desired target frequency. The number of iterations performed by logic synthesis tool 402 may be, for example, a predetermined number of iterations as defined by a user, limited by run time, or the like until a desired functionality is achieved. If a predetermined number of iterations are desired, logic synthesis tool 402 may include a counter that keeps a count of the number of iterations. If logic synthesis is allowed to run for a predetermined amount of time, logic synthesis tool 402 may include a timing device that keeps account of the time logic synthesis has run. Therefore, the modules of logic synthesis tool 402 recognize of the logical equivalence of each of the multiple clock control signal inputs and make the most optimal choice of which of the multiple clock control signal inputs to connect to each local clock buffer in the clocked logic circuit.

Once logic synthesis tool 402 determines a final placement of devices such that the desired target frequency is achieved, or once logic synthesis tool runs as many iterations as possible based on predefined conditions until a desired functionality is achieved, schematic netlist generator 420 generates schematic netlist 426 that provides a detailed description of the devices, their placement, and their connection within the physical boundary of the clocked logic circuit. Additionally, statistics generator 422 generates statistics 424 that may include, for example, number of iterations performed, number of cloned LCBs, number of times devices were replaced, number of times connections were changed, or the like. In the event logic synthesis tool 402 ran for as many iterations as possible but was still not able to determine a final placement of the devices, statistics generator 422 may generate statistics 424 that include errors, such as devices not connected, devices where timing could not be made, or the like.

Schematic netlist 426 generated by schematic netlist generator 420 is then used by logic equivalence checking tool 428. A clock input grouping module 430 within logic equivalence checking tool 428 uses schematic netlist 426 of the clocked logic circuit to mark sets of equivalent clock control signal inputs of the clocked logic circuit with grouping keywords. Using the grouping keywords, clock input grouping module 430 generates interface description file 432 that preserves the clock control signal input group information.

Logic equivalence checking tool 428 also includes clock input merging module 434 and equivalence checking module 436. Clock input merging module 434 uses schematic netlist 426 of the clocked logic circuit along with interface description file 432 to merge the equivalent clock control signal inputs of the clocked logic circuit into a single clock control signal input for equivalence checking. Then, the equivalence checking module 436 performs an equivalence check of schematic netlist 426 with the merged clock control signal input and logic description data 410 of the clocked logic circuit. Equivalence checking may include extracting a logical description of the clocked logic circuit from logic description data 410, matching up the input and output ports of schematic netlist 426 against the logical description, and using various algorithms to ensure that the outputs of both models are the same when driven by the same inputs. Equivalence checking module 436 generates equivalence report 438 once equivalence checking of schematic netlist 426 and logic description data 410 has completed. Equivalence report 438 indicates any discrepancies between schematic netlist 426 and logic description data 410. Thus, the modules of logic equivalence checking tool 428 read the parameters of the clocked logic circuit and the multiple clock control signal inputs thru a schematic netlist and verify the logical equivalence of the clocked logic circuit.

Figure 5A:
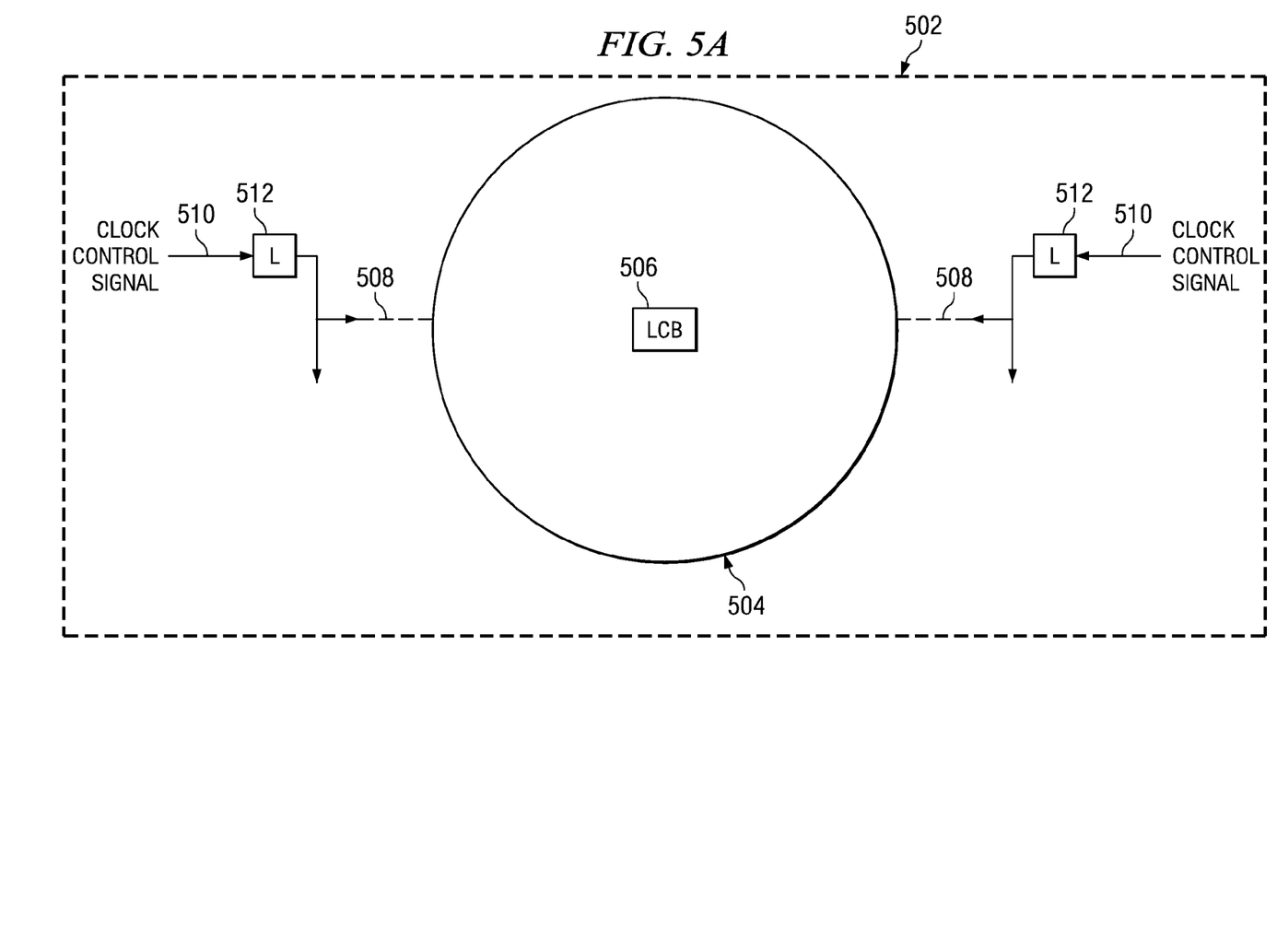
FIGS. 5A and 5B illustrate exemplary connections performed by a logic synthesis tool in accordance with an illustrative embodiment.
Figure 5B:
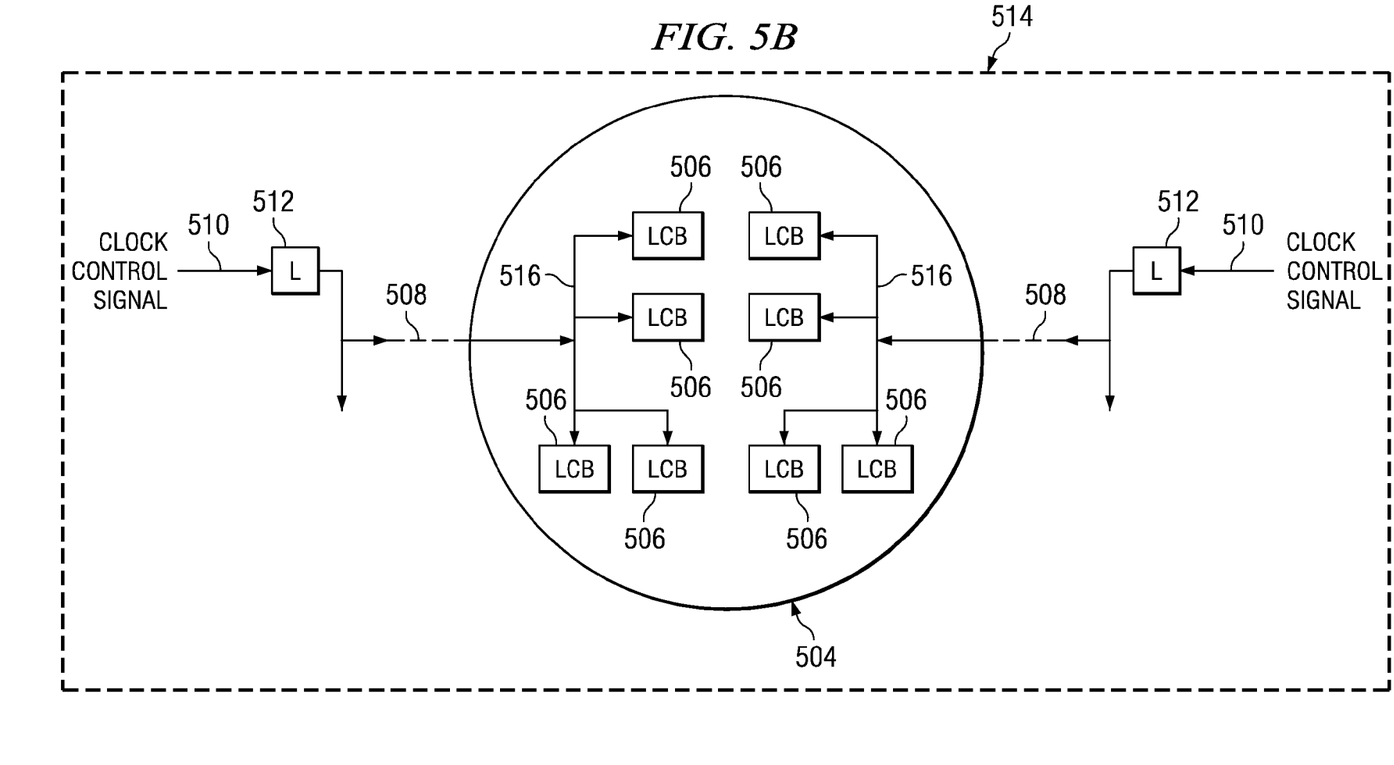

FIGS. 5A and 5B illustrate exemplary connections performed by a logic synthesis tool in accordance with an illustrative embodiment. FIG. 5A depicts an exemplary two-dimensional initial placement 502 of devices associated with a clocked logic circuit by a device placement module, such as device placement module 412 of FIG. 4, that would be described by a logic description and physical boundary, such as logic description data 410 and physical boundary data 406 of FIG. 4. A logic synthesis tool, such as logic synthesis tool 402 of FIG. 4, uses the provided physical boundary to create boundary 504 of the clocked logic circuit. The logic synthesis tool also places local clock buffer (LCB) 506 in FIG. 5A. Although not shown, logic synthesis tool also initially places all of the combinatorial logic and latches of the clocked logic circuit. The location of clock control signal inputs 508 will be provided through the physical boundary. For visualization purposes, clock control signal inputs 508 are shown to be connected to clock control signals 510 from a centralized clock control circuit through staging latches 512.

FIG. 5B depicts an exemplary two-dimensional final placement 514 of devices associated with a clocked logic circuit that would be described by a schematic netlist, such as schematic netlist 426 of FIG. 4. To arrive at final placement 514, the logic synthesis tool initiates a timing module to determine if the target frequency has been achieved. FIG. 5B indicates a requirement of an additional seven LCBs 506 to drive the latches of the clocked logic circuit at the target frequency. A clone LCB module, such as clone LCB module 416 of FIG. 4, clones LCB 506. Once the number of cloned LCBs is determined, then a clock control signal input to LCB connection module, such as clock control signal input to LCB connection module 418 of FIG. 4, determines which of the clock control signal inputs 508 to connect to LCBs 506, such that the clock control signal is driven to the LCBs of the clocked control circuit at the target frequency indicated by connections 516. Again, the logic synthesis tool may perform numerous iterations of placing devices using the device placement module, cloning LCB 506 using the clone LCB module, and connecting clock control signal inputs 508 to LCBs 506 using the clock control signal input to LCB connection module in order that each latch is appropriately controlled by the LCBs, which in turn are correctly controlled by the clock control signals.

Thus, FIGS. 5A and 5B illustrate the determination of a required number of LCBs needed to drive the latches, which in turn drive the combinatorial logic circuits of the clocked logic circuit in order that the clock control signal is driven to the LCBs at the target frequency. Additionally, FIGS. 5A and 5B illustrate the recognition of the logical equivalence of each of the multiple clock control signal inputs and make the most optimal choice of which of the multiple clock control signal inputs to connect to each local clock buffer in the clocked logic circuit.

Figure 6:
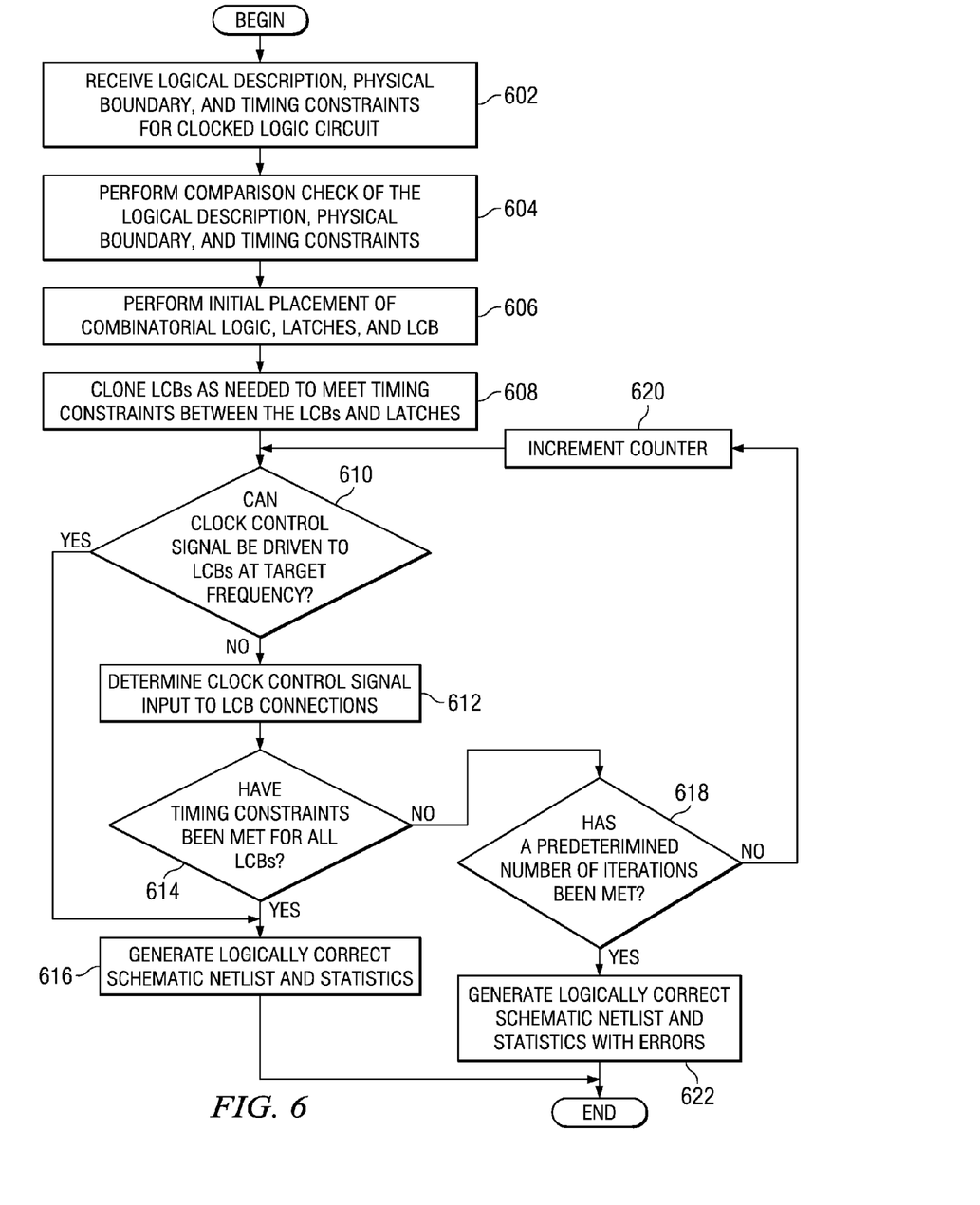
FIG. 6 depicts a flow diagram outlining an exemplary operation performed by a logic synthesis tool in order to achieve timing closure in accordance with an illustrative embodiment.

FIG. 6 depicts a flow diagram outlining an exemplary operation performed by a logic synthesis tool in order to achieve timing closure in accordance with an illustrative embodiment. The described operations are performed by a logic synthesis tool, such as logic synthesis tool 402 of FIG. 4. As the operation begins, a comparison module, such as comparison module 404 of FIG. 4, receives physical boundary data, timing constraints data, and logic description data of a clocked logic circuit as input (step 602). The comparison module performs a comparison check of the inputs to assure that the data provided by the three inputs agrees, prior to continuing the logic synthesis (step 604). Once the comparison module completes the comparison check, a device placement module, such as device placement module 412 of FIG. 4, performs an initial placement of the combinatorial logic circuits, the latches, and a LCB defined in the logic description data within the physical bounds of the clocked logic circuit (step 606).

Once the devices are initially placed, a clone LCB module, such as clone LCB module 416 of FIG. 4, clones LCBs as needed to drive the latches at the target frequency and the device placement module places the devices within the physical boundary of the clocked logic circuit (step 608). Once the number of LCBs are cloned and placed, a timing module, such as timing module 414 of FIG. 4, determines if the clock control signal may be driven to the LCBs of the clocked logic circuit at the target frequency (step 610). If at step 610 the timing module determines that the LCBs are not receiving the clock signal at the target frequency, a clock control signal input to LCB connection module, such as clock control signal input to LCB connection module 418 of FIG. 4, determines a connection of clock control signal inputs to LCBs that will drive the latches at the target frequency (step 612). The logic synthesis tool may perform numerous iterations of connecting clock control signal inputs to LCBs in order that each LCB receives the clock control signal at the desired target frequency.

The timing module then determines if the timing constraints for the clocked logic circuit have been met (step 614). If at step 614 all timing constraints have been met, then a schematic netlist generator, such as schematic netlist generator 420 of FIG. 4, generates a schematic netlist that provides a detailed description of the devices, their placement, and their connection within the physical boundary of the clocked logic circuit and a statistics generator, such as statistics generator 422 of FIG. 4, generates statistics that may include, for example, number of iterations performed, number of cloned LCBs, number of times devices were replaced, number of times connections were changed, or the like (step 616), with the operation ending thereafter. Returning to step 610, if the timing module determines that the target frequency has been achieved, then the operation continues to step 616 with the operation terminating thereafter.

If at step 614 the timing constrains have not been met, then the logic synthesis tool determines if a predetermined number of iterations have been performed (step 618). If at step 618 the number of predetermined iterations have not been performed, then a counter is incremented within the logic synthesis tool (step 620), with the operation returning to step 610. While the exemplary operation shows the limitation of performing logic synthesis based on a number of iterations, the illustrative embodiments recognizes other means of limiting logic synthesis, such as limited by run time, or the like until a desired functionality is achieved. If at step 618 a predetermined number of iterations have been performed, the schematic netlist generator generates a schematic netlist that provides a detailed description of the devices, their placement, and their connection within the physical boundary of the clocked logic circuit as well as statistics that include errors, such as devices not connected, devices where timing could not be made, or the like (step 622), with the operation ending thereafter.

Thus, the operation performed in FIG. 6 determines the required number of LCBs needed to drive the latches, which in turn drive the combinatorial logic circuits of the clocked logic circuit in order that the clock control signal is driven to the LCBs at the target frequency, recognizes the logical equivalence of each of the multiple clock control signal inputs, and make the most optimal choice of which of the multiple clock control signal inputs to connect to each local clock buffer in the clocked logic circuit.

Figure 7:
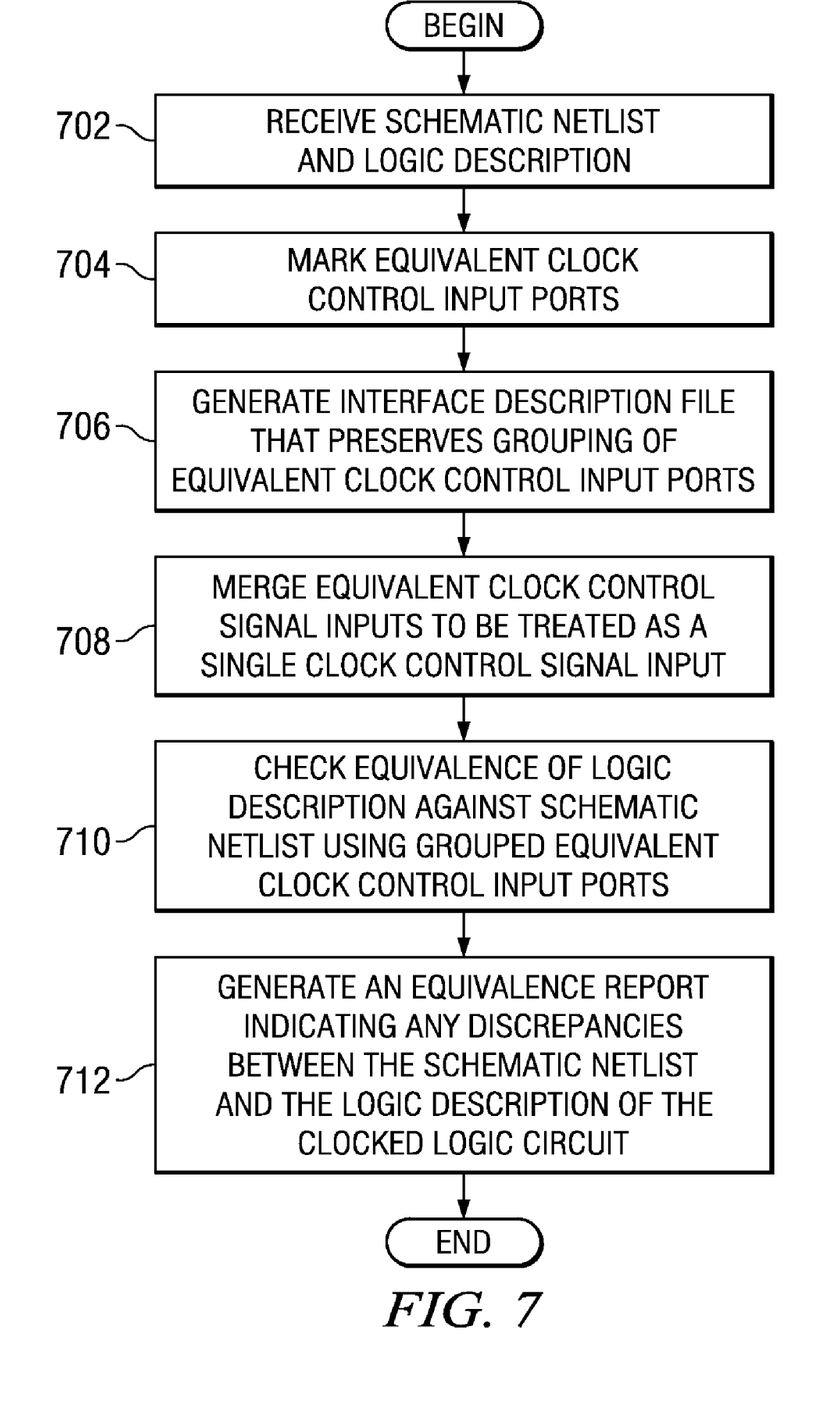
FIG. 7 depicts a flow diagram outlining an exemplary operation performed by a logic equivalence checking tool in order to verify timing closure in accordance with an illustrative embodiment.

FIG. 7 depicts a flow diagram outlining an exemplary operation performed by a logic equivalence checking tool in accordance with an illustrative embodiment. The described operations are performed by a logic equivalence checking tool, such as logic equivalence checking tool 428 of FIG. 4. As the operation begins, the logic equivalence tool receives a schematic netlist and a logic description of a clocked logic circuit (step 702). A clock input grouping module, such as clock input grouping module 430 of FIG. 4, uses the schematic netlist generated by the logic synthesis tool to mark sets of equivalent clock control signal inputs of the clocked logic circuit with grouping keywords (step 704). Using the grouping keywords, the clock input grouping module generates an interface description file that preserves the equivalent clock control signal input group information (step 706).

A clock merging module, such as clock input merging module 434 of FIG. 4, uses the schematic netlist of the clocked logic circuit along with the interface description file to merge the equivalent clock control signal inputs of the clocked logic circuit into a single clock control signal input for equivalence checking (step 708). An equivalence checking module, such as equivalence checking module 436 of FIG. 4, performs an equivalence check of the schematic netlist with the merged clock control signal input and the logic description of the clocked logic circuit (step 710). Once the equivalence checking has completed, the equivalence checking module generates an equivalence report that indicates any discrepancies between the schematic netlist and the logic description of the clocked logic circuit (step 712), with the operation terminating thereafter. Thus, the operation performed in FIG. 7 read parameters of the clocked logic circuit and the multiple clock control signal inputs thru a schematic netlist and verified the logical equivalence of the clocked logic circuit.

Thus, the illustrative embodiments provide for determining a required number of local clock buffers (LCBs) needed to drive the latches, which in turn drive the combinatorial logic circuits of the clocked logic circuit in order that the clock control signal is driven to the LCBs at the target frequency. The illustrative embodiments recognize the logical equivalence of each of the multiple clock control signal inputs and makes the most optimal choice of which of the multiple clock control signal inputs to connect to each local clock buffer in the clocked logic circuit. The illustrative embodiments read parameters of the clocked logic circuit and the multiple clock control signal inputs thru a schematic netlist to verify the logical equivalence of the clocked logic circuit.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method, in a data processing system, for achieving timing closure in a clocked logic circuit, the method comprising:

for a local clock buffer, determining a clock control signal input from a set of clock control signal inputs that will drive a clock control signal to the local clock buffer at a target frequency such that a first timing constraint is met, thereby forming a determined clock control signal input;

responsive to determining the determined clock control signal input, coupling the local clock buffer to the determined clock control signal input that drives the clock control signal to the local clock buffer at the target frequency to achieve timing closure in the clocked logic circuit;

for each latch in a set of latches, determining whether a second timing constraint is met such that a clock signal is driven from the local clock buffer to the latch at the target frequency;

responsive to a failure to drive the latch with the clock signal at the target frequency, determining a number of times the local clock buffer would need to be cloned in order to drive the latch with the clock signal at the target frequency such that the second timing constraint is met; and automatically cloning the local clock buffer the determined number of times, thereby forming a set of local clock buffers.

2. The method of claim 1, further comprising:

responsive to a failure to determine the clock control signal input from the set of clock control signal inputs that will drive the clock control signal to the local clock buffer at the target frequency such that the first timing constraint is met, generating a schematic netlist and statistics that indicate where the first timing constraint could not be met.

3. The method of claim 1, further comprising:

for each latch in the set of latches, determining which local clock buffer in the set of local clock buffers will drive the latch with the clock signal at the target frequency such that the second timing constraint is met, thereby forming a determined local clock buffer; and responsive to determining the determined local clock buffer, coupling the latch to the determined local clock buffer to achieve the timing closure in the clocked logic circuit.

4. The method of claim 1, wherein the first timing constraint and the second timing constraint are dependent on a physical placement of the set of latches, the set of local clock buffers, and the set of clock control signal inputs within a physical boundary of the clocked logic circuit.

5. The method of claim 4, wherein the physical placement of the set of latches and the set of local clock buffers within the physical boundary is arbitrary as long as the first timing constraint and the second timing constraint can be met.

6. The method of claim 4, wherein the physical placement of the set of clock control signal inputs is fixed as defined by data associated with the physical boundary of the clocked logic circuit.

7. A computer program product comprising a computer useable storage medium storing a computer readable program, wherein the computer readable program, when executed in a data processing system, causes the data processing system to:

for a local clock buffer, determine a clock control signal input from a set of clock control signal inputs that will drive a clock control signal to the local clock buffer at a target frequency such that a first timing constraint is met, thereby forming a determined clock control signal input;

couple the local clock buffer to the determined clock control signal input that drives the clock control signal to the local clock buffer at the target frequency to achieve timing closure in a clocked logic circuit in response to determining the determined clock control signal input;

for each latch in a set of latches, determine whether a second timing constraint is met such that a clock signal is driven from the local clock buffer to the latch at the target frequency;

determine a number of times the local clock buffer would need to be cloned in order to drive the latch with the clock signal at the target frequency such that the second timing constraint is met in response to a failure to drive the latch with the clock signal at the target frequency; and automatically clone the local clock buffer the determined number of times, thereby forming a set of local clock buffers.

8. The computer program product of claim 7, wherein the computer readable program further causes the data processing system to:

generate a schematic netlist and statistics that indicate where the first timing constraint could not be met in response to a failure to determine the clock control signal input from the set of clock control signal inputs that will drive the clock control signal to the local clock buffer at the target frequency such that the first timing constraint is met.

9. The computer program product of claim 7 wherein the computer readable program further causes the data processing system to:

for each latch in the set of latches, determine which local clock buffer in the set of local clock buffers will drive the latch with the clock signal at the target frequency such that the second timing constraint is met, thereby forming a determined local clock buffer; and couple the latch to the determined local clock buffer to achieve the timing closure in the clocked logic circuit in response to determining the determined local clock buffer.

10. The computer program product of claim 7, wherein the first timing constraint and the second timing constraint are dependent on a physical placement of the set of latches, the set of local clock buffers, and the set of clock control signal inputs within a physical boundary of the clocked logic circuit.

11. The computer program product of claim 10, wherein the physical placement of the set of latches and the set of local clock buffers within the physical boundary is arbitrary as long as the first timing constraint and the second timing constraint can be met.

12. The computer program product of claim 10, wherein the physical placement of the set of clock control signal inputs is fixed as defined by data associated with the physical boundary of the clocked logic circuit.

13. A system, comprising:
a processor; and
a memory coupled to the processor, wherein the memory comprises instructions which, when executed by the processor, cause the processor to:
for a local clock buffer, determine a clock control signal input from a set of clock control signal inputs that will drive a clock control signal to the local clock buffer at a target frequency such that a first timing constraint is met, thereby forming a determined clock control signal input;
couple the local clock buffer to the determined clock control signal input that drives the clock control signal to the local clock buffer at the target frequency to achieve timing closure in a clocked logic circuit in response to determining the determined clock control signal input;
for each latch in a set of latches, determine whether a second timing constraint is met such that a clock signal is driven from the local clock buffer to the latch at the target frequency;
determine a number of times the local clock buffer would need to be cloned in order to drive the latch with the clock signal at the target frequency such that the second timing constraint is met in response to a failure to drive the latch with the clock signal at the target frequency; and
automatically clone the local clock buffer the determined number of times, thereby forming a set of local clock buffers.

14. The system of claim 13, wherein the instructions further cause the processor to:
generate a schematic netlist and statistics that indicate where the first timing constraint could not be met in response to a failure to determine the clock control signal input from the set of clock control signal inputs that will drive the clock control signal to the local clock buffer at the target frequency such that the first timing constraint is met.

15. The system of claim 13, wherein the instructions further cause the processor to:
for each latch in the set of latches, determine which local clock buffer in the set of local clock buffers will drive the latch with the clock signal at the target frequency such that the second timing constraint is met, thereby forming a determined local clock buffer; and
couple the latch to the determined local clock buffer to achieve the timing closure in the clocked logic circuit in response to determining the determined local clock buffer.

16. The system of claim 13, wherein the first timing constraint and the second timing constraint are dependent on a physical placement of the set of latches, the set of local clock buffers, and the set of clock control signal inputs within a physical boundary of the clocked logic circuit.

17. The system of claim 16, wherein the physical placement of the set of latches and the set of local clock buffers within the physical boundary is arbitrary as long as the first timing constraint and the second timing constraint can be met and wherein the physical placement of the set of clock control signal inputs is fixed as defined by data associated with the physical boundary of the clocked logic circuit.

* * * * *